(12) United States Patent
Di Sarro et al.

(10) Patent No.: US 10,396,550 B2
(45) Date of Patent: Aug. 27, 2019

(54) ESD PROTECTION CHARGE PUMP ACTIVE CLAMP FOR LOW-LEAKAGE APPLICATIONS

(71) Applicant: Texas Instruments Incorporated, Dallas, TX (US)

(72) Inventors: James P. Di Sarro, Plano, TX (US); Farzan Farbiz, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 233 days.

(21) Appl. No.: 15/281,379

(22) Filed: Sep. 30, 2016

(65) Prior Publication Data

US 2018/0097357 A1    Apr. 5, 2018

(51) Int. Cl.
*H02H 9/04* (2006.01)
*H01L 27/02* (2006.01)
*H02H 1/00* (2006.01)

(52) U.S. Cl.
CPC ......... *H02H 9/046* (2013.01); *H01L 27/0266* (2013.01); *H01L 27/0288* (2013.01); *H02H 1/0061* (2013.01)

(58) Field of Classification Search
CPC .. H01L 27/0266; H01L 27/0248–0296; H02H 9/046
See application file for complete search history.

(56) References Cited

U.S. PATENT DOCUMENTS

| | | | |
|---|---|---|---|
| 5,239,440 A | 8/1993 | Merrill | |
| 5,852,541 A * | 12/1998 | Lin | H01L 27/0248 361/111 |
| 5,946,177 A * | 8/1999 | Miller | H01L 27/0248 361/56 |
| 6,043,967 A * | 3/2000 | Lin | H02H 9/046 361/111 |
| 6,091,593 A * | 7/2000 | Lin | H01L 27/0251 361/111 |
| 6,400,540 B1 | 6/2002 | Chang | |
| 6,624,992 B1 * | 9/2003 | Aparin | H02H 9/046 361/56 |
| 7,286,331 B2 | 10/2007 | Choi | |
| 7,821,752 B2 | 10/2010 | Choi | |
| 8,093,623 B2 | 1/2012 | Mawatari et al. | |
| 8,865,541 B2 | 10/2014 | Farbiz et al. | |
| 9,224,724 B2 | 12/2015 | Salman et al. | |

(Continued)

OTHER PUBLICATIONS

Patent Cooperation Treaty Search Report, dated Feb. 7, 2018, PCT/US2017/054754, Applicant: Texas Instruments Incorporated.

(Continued)

*Primary Examiner* — Ronald W Leja
*Assistant Examiner* — Christopher J Clark
(74) *Attorney, Agent, or Firm* — Rose Alyssa Keagy; Charles A. Brill; Frank D. Cimino

(57) ABSTRACT

Disclosed examples include an electrostatic discharge protection circuit including a shunt transistor coupled between first and second power supply nodes, a sensing circuit to deliver a control voltage signal to turn on the shunt transistor in response to a detected change in a voltage of the first power supply node resulting from an ESD stress event, and a charge pump circuit to boost the control voltage signal in response to the control voltage signal turning the shunt transistor on.

24 Claims, 6 Drawing Sheets

(56) References Cited

U.S. PATENT DOCUMENTS

| | | | |
|---|---|---|---|
| 9,337,651 B2* | 5/2016 | Lee | H02H 9/04 |
| 9,413,169 B2* | 8/2016 | Di Sarro | H02H 9/046 |
| 9,685,780 B2* | 6/2017 | Tsaur | H02H 9/041 |
| 9,973,000 B2* | 5/2018 | Lai | H01L 27/0255 |
| 2003/0214768 A1* | 11/2003 | Lin | H01L 27/0274 361/56 |
| 2010/0027175 A1* | 2/2010 | Negoi | H01L 27/0285 361/56 |
| 2010/0238598 A1 | 9/2010 | Liang et al. | |
| 2011/0222196 A1 | 9/2011 | Smith | |
| 2012/0091504 A1 | 4/2012 | Davis et al. | |
| 2012/0161232 A1 | 6/2012 | Farbiz et al. | |
| 2013/0077197 A1 | 3/2013 | Soldner et al. | |
| 2013/0215539 A1* | 8/2013 | Chu | H02H 9/046 361/56 |
| 2013/0222954 A1* | 8/2013 | Demange | H02H 9/046 361/56 |
| 2013/0238273 A1* | 9/2013 | Tercariol | G01R 19/0084 702/117 |
| 2013/0293991 A1* | 11/2013 | Chu | H02H 9/046 361/56 |
| 2015/0146330 A1 | 5/2015 | Appaswamy et al. | |
| 2015/0270253 A1 | 9/2015 | Farbiz et al. | |
| 2016/0172850 A1* | 6/2016 | Ellis-Monaghan | H02H 9/046 361/56 |
| 2016/0233668 A1* | 8/2016 | Dai | H01L 23/5286 |
| 2017/0229444 A1* | 8/2017 | Torres | H01L 27/0266 |
| 2017/0338646 A1* | 11/2017 | Djelassi | H02H 1/0007 |

OTHER PUBLICATIONS

M. Stockinger et al. "Boosted and Distributed Rail Clamp Networks for ESD Protection in Advanced CMOS Technologies," EOS/ESD Symp. Proc., 2003, 10 pages.

M. Ker et al. "How to safely apply the LVTSCR for CMOS whole-chip ESD protection without being accidentally triggered on," Journal of Electrostatics 47 (1999), pp. 215-248.

* cited by examiner

ESD PROTECTION CHARGE PUMP ACTIVE CLAMP FOR LOW-LEAKAGE APPLICATIONS

BACKGROUND

Integrated circuits (ICs) are often subjected to electrostatic discharge (ESD) events through contact with a charged body (e.g., a human) that cause high voltages at one or more pins, pads or terminals of the IC. ESD events can damage an IC through thermal runaway and resultant junction shorting and/or dielectric breakdown causing gate junction shorting in metal oxide semiconductor (MOS) circuits when the amount of charge exceeds the capability of the electrical conduction path through the IC. Protection circuits can be provided in an IC, such as clamp circuits to shunt ESD current between two supply nodes. However, ESD shunt transistors are typically very large in order to conduct significant amounts of ESD-related current. The large size of the shunt transistors reduces the space for other circuitry in an integrated circuit, and also increases shunt transistor leakage current thereby increasing circuit power consumption.

SUMMARY

Disclosed examples provide ESD protection circuitry with a shunt transistor coupled between power supply nodes, along with a sensing circuit to deliver a control voltage signal to turn on the shunt transistor in response to a detected ESD stress event, and a charge pump circuit to boost the control voltage signal in response to the control voltage signal turning on the shunt transistor. The charge pump enhances the on state drive of the shunt transistor to facilitate increased shunt current capability and/or to allow the use of a smaller shunt transistor than would otherwise be required for a given level of ESD protection. Boosting the control voltage signal and reducing the shunt transistor size reduces overall ESD protection circuit size and reduces shunt transistor leakage current to enhance circuit power efficiency. In certain examples, a blocking circuit prevents current flow from the charge pump to a protected supply node, and allows current flow from the protected node to charge a capacitor of the charge pump circuit. The charge pump circuit in certain examples includes a capacitor, a trigger transistor, and one or more inverters that charge the capacitor when the shunt transistors are turned off and discharge the capacitor to boost the control voltage signal in response to the control voltage signal turning the shunt transistor on.

DETAILED DESCRIPTION

Figure 1:
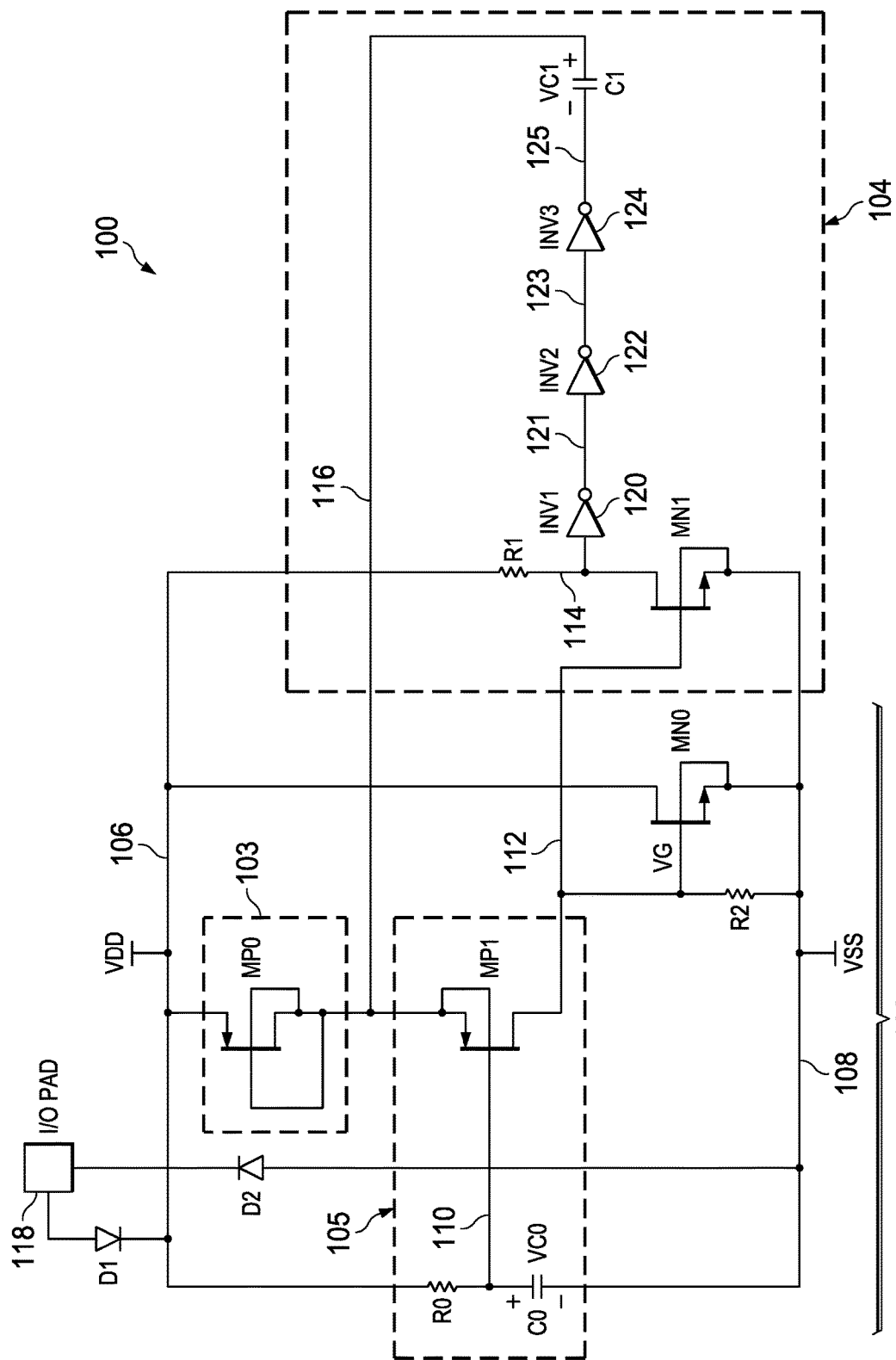
FIG. 1 is a schematic diagram of an ESD protection circuit including a shunt transistor, a sensing circuit to turn on the shunt transistor based on a detected ESD event, a diode connected MOS transistor blocking circuit, and a charge pump to boost the shunt transistor drive signal according to an embodiment of the present disclosure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Integrated circuits may be damaged by an ESD event during manufacturing, assembly, testing, or during normal operation in a given application. As described herein, an ESD stress event can be understood as including an event on an I/O or power pad or other externally accessible node of a circuit that creates an elevated voltage (e.g., with respect to VSS or other voltage reference node) that is higher than a voltage which is normally supplied to the pad (e.g., higher than VDD) or other ESD event that can stress or degrade a circuit component unless attenuated by ESD protection circuitry. For example, an ESD stress event may include events used in testing ESD immunity classification for the human body model (HBM Classes 0, 1A, 1B, 1C, 2, 3A and 3B), the charge device model (CDM Classes C1, C2, C3, C4, C5 and C6), and the machine model (MM Classes M1, M2, M3 and M4). The Human Body Model simulates ESD due to discharge from human beings, and the various levels of the HBM classifications are often used to describe an ESD stress event. CDM simulates the discharge of a charged device when it comes in contact with a conductive material, and MM represents a discharge from an object to the component. Many ICs include host circuitry that can be damaged by ESD events that deliver high voltages to one or more IC terminals (e.g., pins, pads). Active ESD protection circuits have been used that include active clamp circuits to shunt ESD current between the power supply rails in order to protect the internal circuitry. For example, a large MOS transistor can be coupled between the power supply rails and driven by a control signal to shunt ESD current to protect circuitry connected to the supply rails. However, the MOS shunt transistor is relatively large and often occupies the majority of the total area of the ESD protection circuitry. This problem is exacerbated in cases where each IC pin is provided with a corresponding ESD protection circuit including a large shunt transistor.

Referring to FIG. 1, an example ESD protection circuit 100 includes an active clamp circuit 102 with a shunt transistor MN0 coupled between first and second power supply nodes or rails 106 (e.g., VDD) and 108 (e.g., VSS).

In one example, the first power supply node 106 is a voltage VDD (e.g., 3.3 V) that is positive relative to the voltage VSS of the second power supply node 108 (e.g., circuit ground). The circuit 100 can be fabricated in an integrated circuit (IC) that includes host circuitry and one or more I/O pads 118 to provide external connectivity to the host circuitry, as described further in connection with FIG. 7 below. The example of FIG. 1 illustrates one such I/O pad 118. In this example, the pad 118 is connected to the supply nodes 106 and 108 by diodes D1 and D2, respectively. The first diode D1 includes an anode connected to the I/O pad 118 as well as a cathode connected to the supply node 106, for example, to allow ESD current from an event associated with the I/O pad 118 to flow into the first supply node 106. A second diode D2 includes an anode connected to the second supply node 108, and a cathode connected to the I/O pad 118 to allow current flow from the second supply node 108 to the I/O pad 118. In this configuration, protection provided by the ESD circuit 100 can protect a host circuit (not shown) connected to the I/O pad 118, as well as any circuits connected to the supply nodes 106 and 108.

The ESD circuit 100 in this example provides protection against ESD events associated with I/O pads 118 as well as pads connected directly to the supply nodes 106 and/or 108, and protects the circuits of a host IC against I/O pad-to-VSS and VDD-to-VSS ESD stress events. In addition, the ESD circuit 100 allows the use of significantly smaller shunt transistors MN0 than conventional designs by boosting a gate control voltage signal VG provided to the control terminal 112 of the shunt transistor MN0 in response to the control voltage signal VG turning the shunt transistor MN0 on using a charge pump circuit 104. In this manner, a relatively small shunt transistor MN0 can be driven at a higher gate voltage in order to conduct more ESD stress current from the first power supply node 106 to the second supply node 108 than would otherwise be possible using a gate control signal that is less than VDD.

The shunt transistor MN0 in this example is an NMOS transistor with a drain connected to the first supply node 106, a source connected to the second supply node 108, and a gate control terminal 112. The active clamp circuit 102 also includes a sensing circuit 105 that delivers a control voltage signal VG to turn on MN0 in response to a detected change (e.g., increase) in the voltage VDD that results from an ESD stress event. The sensing circuit 105 includes a resistor R0 with an upper first terminal connected to the supply node 106, and a second terminal connected to a first internal node 110. A capacitor C0 is connected in series with R0 between the first internal node 110 and the second power supply node 108. A PMOS sensing transistor MP1 is used to sense or detect ESD events associated with the supply node 106. The sensing transistor MP1 includes a source connected to a blocking circuit 103 at a second internal node 116, and a drain connected to the gate 112 of the shunt transistor MN0. The gate control terminal of MP1 is connected to the first internal node 110 to sense the voltage across the sensing capacitor C0. The sensing circuit 105 indirectly senses the supply voltage VDD by detecting a change (e.g., an increase) in VDD relative to the capacitor voltage VC0 across C0. The sensing circuit 105 provides the control voltage signal VG to turn on MN0 in response to a detected increase in the voltage VDD resulting from an ESD stress event.

The blocking circuit 103 is connected between the first power supply node 106 and the sensing circuit 105. The circuit 103 blocks or otherwise prevents current flow from the charge pump circuit 104 to the first power supply node. This facilitates boosting of the control voltage VG by the charge pump circuit 104 for enhanced ESD current shunting and/or reduction in the size of MN0. The blocking circuit also 106 allows current flow from the supply node 106 to the charge pump circuit 103 to facilitate charging of a capacitor in the charge pump circuit 104. The blocking circuit 103 in FIG. 1 includes a PMOS transistor MP0 with a source connected to the supply node 106, as well as a gate, a drain and a body connected to the sensing circuit 105 and the charge pump circuit 104 at the node 116 to provide a forward source-to-body diode from the supply node 106 to the sensing circuit 105. Other blocking circuits can be used which prevent current flow from the node 116 to the node 106, while allowing current flow in the opposite direction.

The charge pump circuit 104 includes a charge pump capacitor C1, and a switching circuit including a charge pump trigger transistor MN1 and an odd number N inverters, where N≥1. In the example of FIG. 1, three inverters 120, 122 and 124 are connected in series with one another between the transistor MN1 and the capacitor C1. The capacitor C1 in FIG. 1 includes a first terminal as well as a second terminal connected to the blocking circuit 103 at the second internal node 116. The inverters form an inverter circuit that includes an inverter circuit input 114 and an inverter circuit output 125 connected to the first terminal of the charge pump capacitor C1. In certain examples, the charge pump capacitor C1 has a capacitance on the order of the gate capacitance of the shunt transistor MN0 to provide a significant gate voltage boost during ESD events. The charge pump trigger transistor MN1 in this example is an NMOS transistor with a source connected to the second power supply node 108, a drain connected to the inverter circuit input 114, and a gate connected to the gate 112 of the shunt transistor MN0. A resistor R1 is connected between the inverter circuit input 114 and the first power supply node 106. The transistor MN1 and the resistor R1 form a voltage divider to provide a trigger voltage signal at the inverter circuit input 114 in order to switch the first inverter 120.

Figure 2:
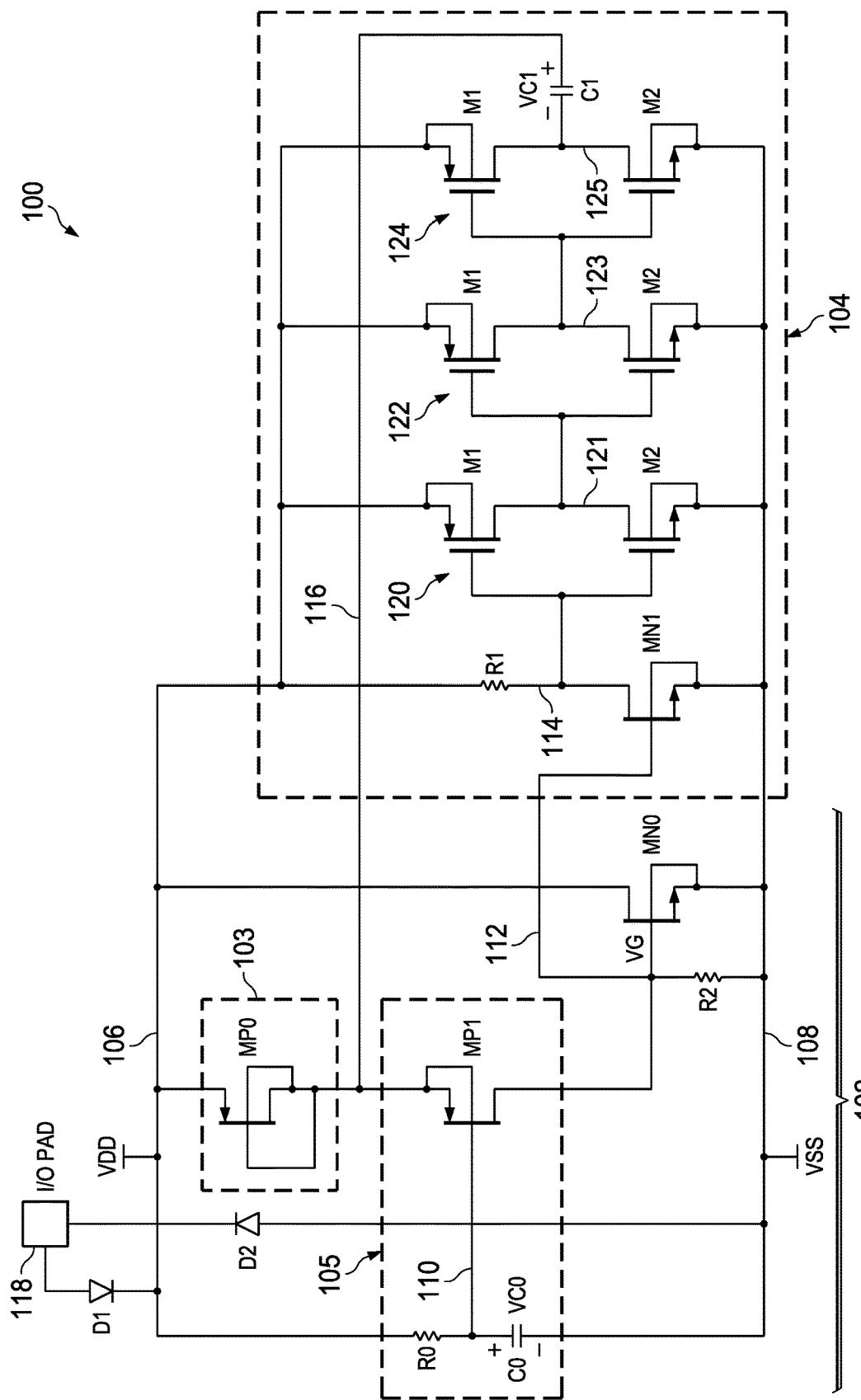
FIG. 2 is a schematic diagram showing further details of an example charge pump including CMOS inverter stages forming a switch circuit of the charge pump in the ESD protection circuit according to another embodiment of the present disclosure.

Referring also to FIG. 2, in one example, the inverters 120, 122 are 124 are CMOS inverters. Each inverter in this example includes an inverter input, and an inverter output 121, 123 and 125, respectively. The individual inverters 120, 122 and 124 also include an upper PMOS transistor M1 with a source connected to the positive supply node 106, a drain connected to the inverter output, and a gate connected to the inverter input. The individual inverters also include a lower NMOS transistor M2 having a source connected to the supply node 108, a drain connected to the inverter output and a gate connected to the corresponding inverter input. The switching circuit MN1, 120, 122 and 124 operates according to the control voltage signal VG to charge C1 in normal operation when the shunt transistor MN0 is off. The switching circuit switches the voltage of the first charge pump capacitor terminal to discharge C1 and thereby boost the control voltage signal VG in response to the signal VG turning the shunt transistor MN0 on.

In normal operation (e.g., VDD=3.3 V, VSS=0 V), the capacitor C0 charges up to VDD through the resistor R0. This provides a high gate voltage on the internal node 110 which turns off MP1. In this state, the voltage at the node 116 is approximately one diode drop below VDD. In addition, the voltage at the gate 112 of the shunt transistor MN0 is approximately 0 V, as any residual gate voltage from a previous ESD protection event is discharged through the resistor R2. The low voltage on the node 112 ensures that MN0 is off. Moreover, the disclosed boosting operation allows reduction in the size of MN0, and thus reduces any normal operating mode leakage current through MN0. In normal operation, the low voltage on the node 112 turns off the NMOS transistor MN1, and no current flows through R1. In this condition, the voltage at the inverter circuit input 114 is high (e.g., approximately VDD). The first inverter 120 accordingly provides a low signal to its output 121, and the output of the second inverter 122 is high. As a result, the final inverter 124 provides a low voltage at the inverter circuit output 125 (e.g., approximately VSS) to the first terminal of the capacitor C1. In steady state operation, C1 charges up and the resulting charge pump capacitor voltage VC1 is close to VDD, due to the diode drop across the transistor MP0 of the blocking circuit 103.

During an ESD event associated with the first supply node 106 (or the diode-connected I/O pad 118), the voltage VDD of the first supply node 106 will increase. The increase in the voltage VDD causes the sensing transistor MP1 to turn on because the capacitor voltage VC0 does not change instantaneously, and the voltage at the gate 110 of MP1 is more than a threshold voltage amount below the voltage at the source node 116 of MP1. As MP1 turns on, the voltage at the control terminal 112 rises. This increases the gate voltage VG of the shunt transistor MN0, and the gate voltage of the charge pump trigger transistor MN1. The sensing circuit transistor MP1 thus provides the control voltage signal VG to the gate 112 to turn on MN0 in response to an increase in a voltage of the second internal node 116 caused by an increase in VDD resulting from the an ESD stress event. Turning on MN0 causes MN0 to begin conducting ESD current from the first supply node 106 to the second supply node 108. In addition, the rise in the control voltage signal VG turns on MN1. In this condition, MN1 and R1 provide a voltage divider, and the voltage at the node 114 drops below the threshold voltage of the PMOS transistor M1 of the first inverter 120 (FIG. 2). This changes the voltage at the first inverter output 121 to a high value. The second inverter 122 accordingly provides a low voltage at its output 123, and the final inverter 124 provides a high output voltage at the inverter circuit output node 125. In this condition, the voltage at the first terminal 125 of the charge pump capacitor C1 is close to VDD (M1 of the third inverter 124 is on in FIG. 2). The previous charging of the charge capacitor C1 thus boosts the voltage at the node 116 above VDD through charge distribution, while the blocking circuit 103 prevents current flow from the node 116 to the supply node 106. This boosting of the voltage at the node 116, in turn, increases the control voltage signal VG at the node 112, to further enhance the drive of the shunt transistor MN0, and thus increase the amount of ESD current shunted by the transistor MN0.

MN0 is sized according to a given set of ESD protection parameters for a given application, such that continued conduction of shunt current by MN0 prevents significant overvoltage conditions on the supply node 106. The time constant of the sensing circuit RC network R0, C0 is set to be on the order of (or slightly larger than) the duration of an expected ESD event. In this configuration of the active clamp, R0*C0 is used to detect the rising edge of the ESD stress event, and is set to be slightly larger than the maximum expected rise-time, e.g., 50-100 ns. The RC time constant that determines the duration that the active clamp will remain active is formed by the parasitic gate capacitance of MN0 and the discharge resistor R2, and is on the order of several microseconds in one example. The rise in the VDD voltage at the supply node 106 causes further charging of the sensing circuit capacitor C0 through the resistor R0, which eventually raises the voltage at the node 110 (VC0) to a level that turns off the sensing transistor MP1. As a result, the control voltage signal VG at the node 112 is reduced by discharging the gate capacitance of MN0, which turns off the shunt transistor MN0 and the charge pump trigger transistor MN1. The voltage at the inverter circuit input 114 is pulled up by R1 to approximately VDD, and the inverter outputs 121, 123 and 125 return to low, high and low levels, respectively. The low voltage at the first terminal of the charge pump capacitor C1 allows the capacitor C1 to again charge to slightly less than VDD via current flow through the blocking circuit 103.

Figure 3:
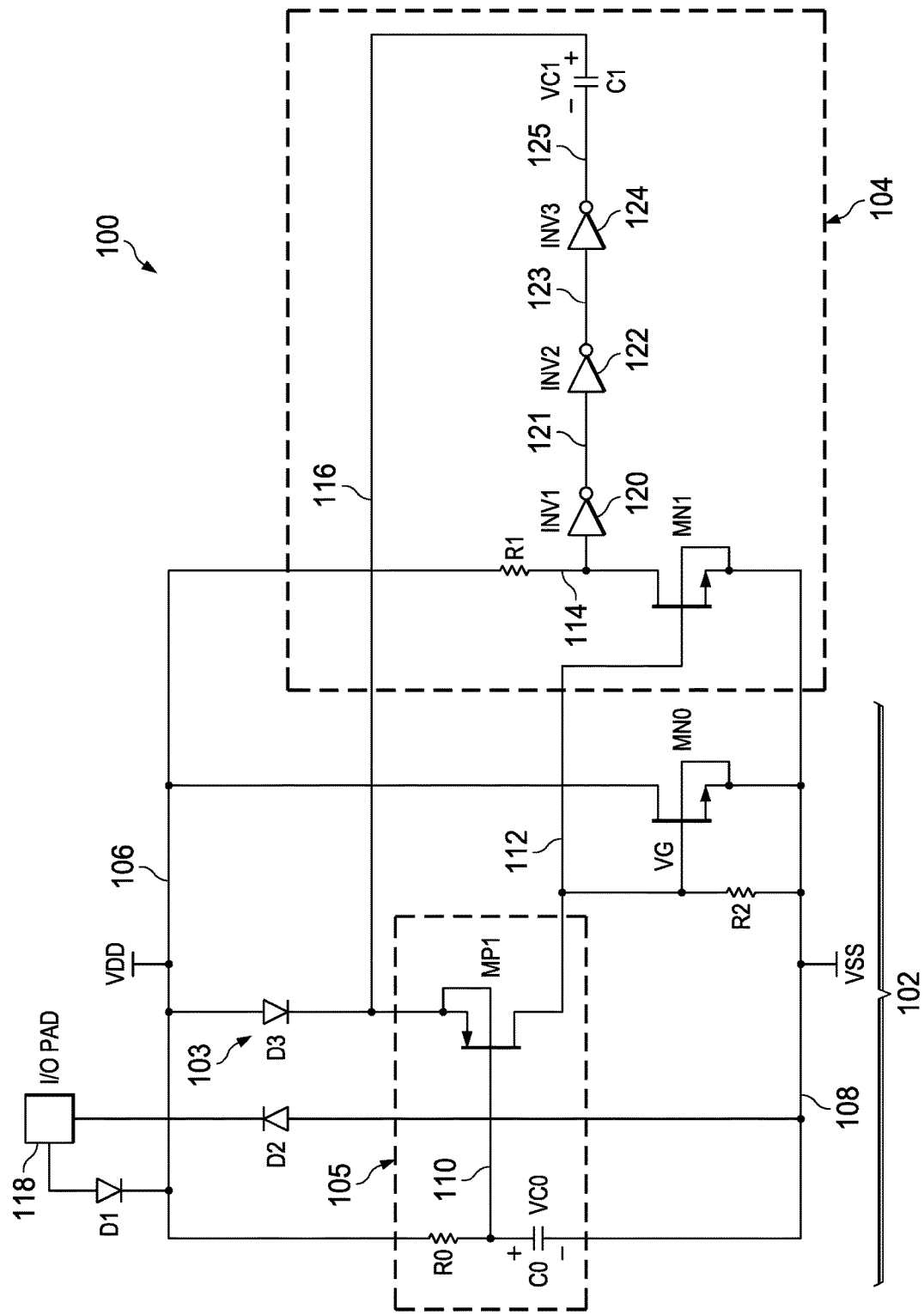
FIG. 3 is a schematic diagram of another example ESD protection circuit using a diode blocking circuit according to another embodiment of the present disclosure.

FIG. 3 shows another example ESD protection circuit in which the blocking circuit 103 includes a diode D3 that prevents current flow from the charge pump capacitor C1 to the supply node 106 and allows current flow from the supply node 106 to the charge pump capacitor C1. In this example, the anode of D3 is connected to the supply node 106, and the cathode of D3 is connected to the sensing circuit 105.

Figure 4:
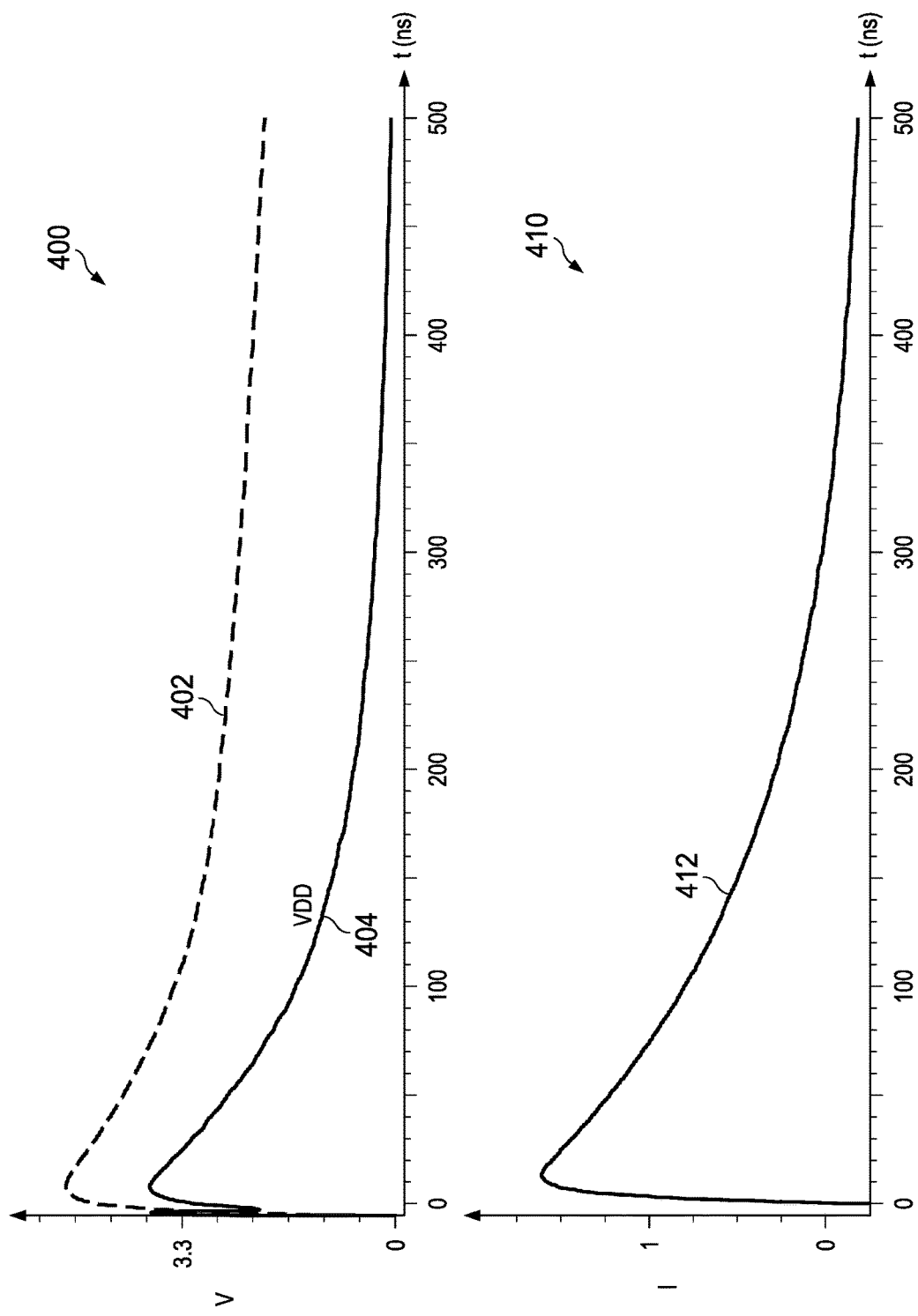
FIG. 4 is a signal diagram of gate voltage, pad voltage and ESD current in the ESD protection circuit of FIG. 1.
Figure 5:
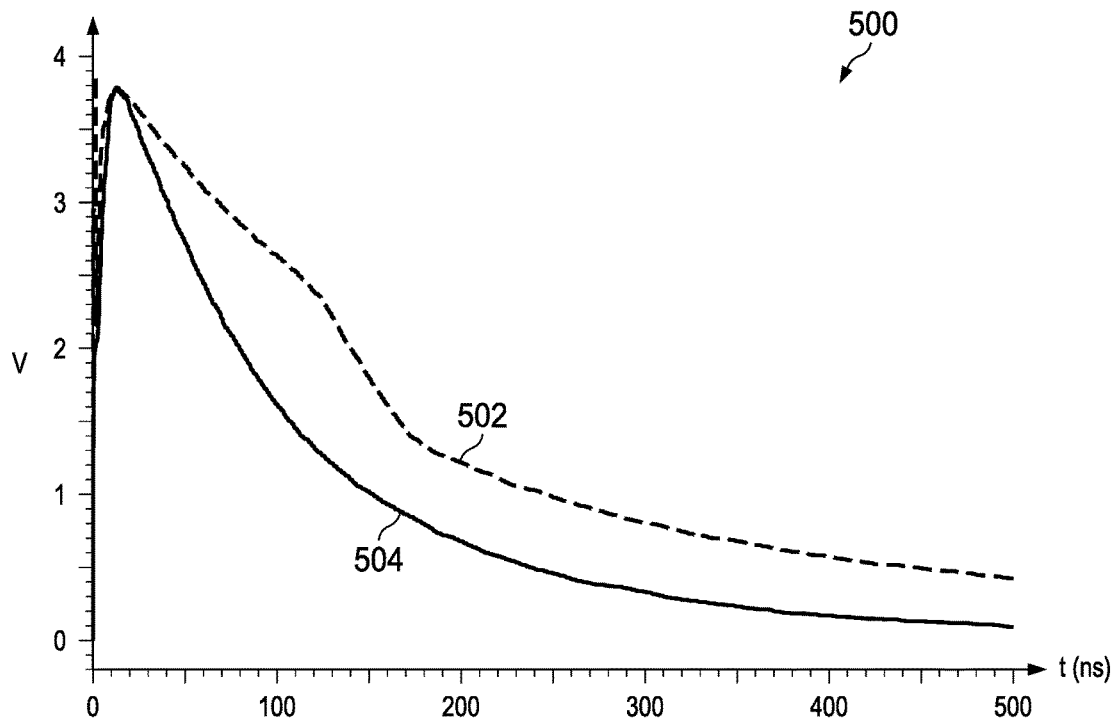
FIG. 5 is a signal diagram of pad voltages for a standard active clamp with a large shunt transistor and the ESD protection circuit of FIG. 1 with a smaller shunt transistor.
Figure 6:
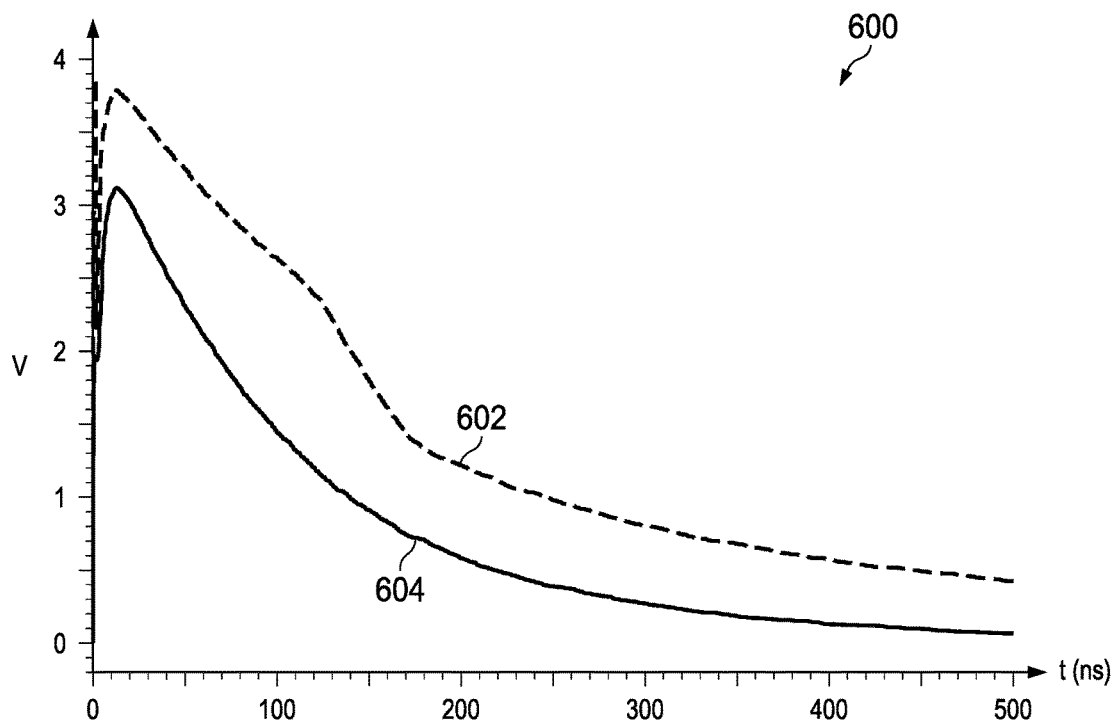
FIG. 6 is a signal diagram of pad voltages for a standard active clamp and the ESD protection circuit of FIG. 1 with similar sized shunt transistors.

Referring now to FIGS. 4-6, FIG. 4 shows a signal diagram including a voltage graph 400 with a gate voltage curve 402 illustrating the control voltage signal VG at the gate control terminal 112 of the shunt transistor MN0, as well as a pad voltage curve 404 illustrating the voltage VDD at the first supply node 106 during an ESD event in the protection circuit 100 of FIG. 1. In one example, the ESD event can be approximated by a human body model (HBM) voltage pulse of 2 kV applied to the first supply node 106 or to the I/O pad 118. FIG. 4 also shows a current graph 410 with a curve 412 illustrating the shunt current conducted by the transistor MN0 during the ESD event. In this example, the charge pump capacitor C1 is switched by the inverter circuit during a rising edge of the HBM pulse. The ESD protection circuit 100 enables the NMOS shunt transistor MN0 by a boosted control voltage signal VG at the gate 112 of approximately 1.3 V above the VDD voltage at the node 106. As seen in the voltage graph 400, the circuit 100 effectively controls the voltage at the protected node 106, and the curve 404 includes an initial rise, followed by a drop resulting from operation of the circuit 100 to turn on the shunt transistor MN0.

FIG. 5 shows a signal diagram 500 including a curve 502 corresponding to the pad voltage at a protected positive supply node during an ESD event for a conventional active clamp circuit using a large shunt transistor (e.g., having a channel width of 4050 μm). The diagram 500 also shows a curve 504 illustrating the VDD voltage at the node 106 using the ESD protection circuit 100 MN0 with a smaller shunt transistor having a width of 2700 μm. As seen in FIG. 5, the curves 502 and 504 show that the disclosed protection circuits 100 provide equivalent ESD protection using a significantly smaller shunt transistor MN0. Also, the reduction in the transistor width allows significant reduction in the drain-source capacitance of the shunt transistor MN0, and thus significantly reduces any leakage current associated with the shunt transistor thereby improving efficiency.

FIG. 6 provides a graph 600 illustrating protected node voltage curves 602 and 604 respectively corresponding to a standard active clamp and the ESD protection circuit 100 where similar sized shunt transistors are used. In this example, transistor channel widths of 4050 μm are used for both circuits. As seen in FIG. 6, the disclosed example ESD protection circuits 100 using the charge pump circuit 104 enhance the drive of the shunt transistor MN0, and reduce the peak ESD voltage at the protected node 106 by more than 0.6 V. In the above examples, a charge capacitor C1 of approximately 7 pF is used in the charge pump circuit 104. The charge pump circuit 104 itself occupies significantly less space than the shunt transistor MN0, being primarily constructed of MOS transistors MN1, M1, M2 and a small charge pump capacitor C1 serving to selectively boost the gate control voltage signal VG used in turning on the shunt transistor MN0. Accordingly, a protected integrated circuit can use the disclosed examples 100 to protect internal circuitry against ESD events using a reduced amount of space compared to conventional active shunt circuit techniques. In addition, the potential reduction in the size of the shunt transistor MN0 reduces the power consumption of the resulting IC due to reduced shunt transistor capacitance and the associated leakage current during normal operation.

Figure 7:
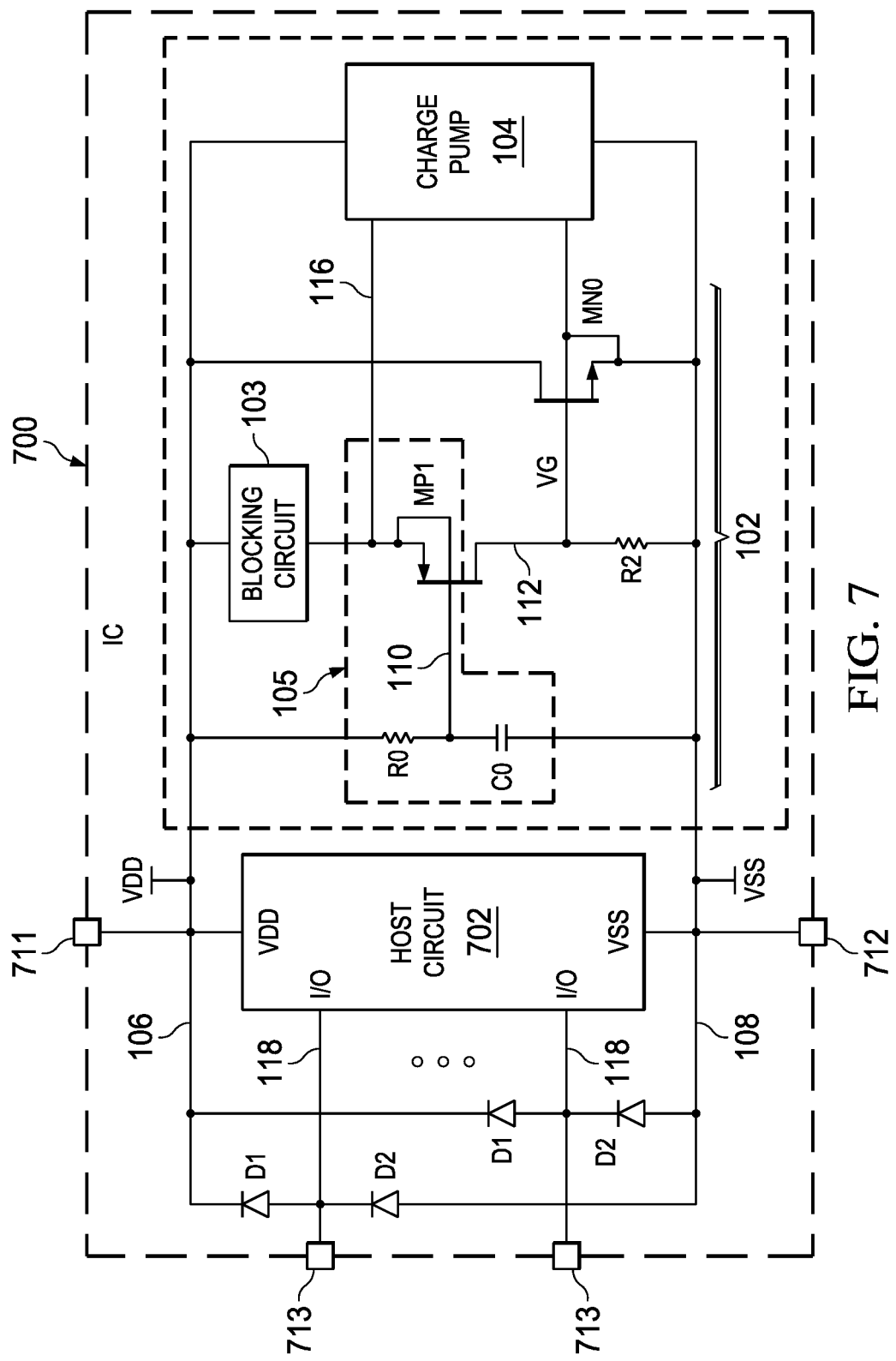
FIG. 7 is a schematic diagram of an IC including the ESD protection circuit of FIG. 1 according to another embodiment of the present disclosure.

FIG. 7 shows an IC 700 including the ESD protection circuit 100 of FIG. 1. The IC 700 includes first and second supply nodes 106 (VDD) and 108 (VSS) as discussed above. The supply node 106 in this case is connected to an external terminal (e.g., pad or pin) 711, and the second supply node 108 (VSS) is connected to another IC terminal 712. In addition, the ICU 700 includes a host circuit 702 (e.g., amplifier circuit, power conversion circuit) which is connected to the supply nodes 106 and 108, as well as to one or more I/O pads or nodes 118. The I/O nodes 118 are externally accessible to other external circuits (not shown) by way of corresponding IC terminals 713. The IC 700 also includes an ESD protection circuit 100 as described above, including a sensing circuit 105, a blocking circuit 103, a shunt transistor MN0 and a charge pump circuit 104. The individual I/O terminals 713 and the associated I/O nodes 118 are diode connected to the first and second supply nodes 106 and 108 using corresponding diodes D1 and D2, respectively, as discussed above. The protection circuit 100 activates the transistor MN0 to shunt ESD current from the supply terminal 106 to the second supply terminal 108 in response to ESD events associated with the supply terminal 711 and/or the I/O terminals 713. In this manner, the host circuitry 702 is protected against ESD events even though connected to the supply nodes 106, 108 and the I/O nodes 118.

Other implementations are possible, for example, by substituting NMOS for PMOS transistors and vice versa in the circuit 100 in order to provide protection for ESD events on the VSS node 108. The disclosed protection circuits 100 can be employed to advantageously mitigate or avoid problems associated with conventional active clamp circuits. In particular, for a given level of ESD robustness, active clamps have a comparatively large area that is largely determined by the area of a single large FET that generally has a total width of at least several thousand µm, and an associated high level of off state drain leakage current leading to undesirable power consumption that may be unsuitable for some applications. Disclosed examples facilitate a significant reduction in the size of the shunt transistor MN0 while maintaining the same level of ESD protection (e.g., as seen in the curves 502 and 504 of FIG. 5) by driving the gate voltage VG above both its drain voltage and the voltage on the protected supply node 106. The inclusion of the charge pump circuit 104 enables the gate voltage of the large FET to exceed its drain voltage, unlike in conventional active clamps. Increased gate drive allows the total width of the large PET to be decreased while maintaining the same ESD clamping voltage or a lower ESD clamping voltage for the same large PET width, leading to a more favorable combination of ESD protection level, leakage and area. Moreover, the disclosed examples 100 do not require the addition of a separate power nodes or buses for providing a shunt transistor gate control signal, and the addition of the charge pump circuit 104 provides a low complexity solution.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The invention claimed is:

1. An electrostatic discharge (ESD) protection circuit, comprising:
   a clamp circuit, including:
      a shunt transistor coupled between a first power supply node and a second power supply node, the shunt transistor including a control terminal, and
      a sensing circuit configured to sense a voltage of the first power supply node, and to provide a control voltage signal to the control terminal to turn on the shunt transistor in response to a detected increase in the voltage of the first power supply node resulting from an ESD stress event; and
   a charge pump circuit, including:
      a charge pump capacitor, and
      a switching circuit configured to charge the charge pump capacitor when the shunt transistor is off and to discharge the charge pump capacitor to boost the control voltage signal in response to the control voltage signal turning the shunt transistor on.

2. The ESD protection circuit of claim 1, further comprising:
   a blocking circuit connected between the first power supply node and the sensing circuit, the blocking circuit configured to prevent current flow from the charge pump capacitor to the first power supply node, and to allow current flow from the first power supply node to the charge pump capacitor.

3. The ESD protection circuit of claim 2, wherein the blocking circuit includes a diode having an anode connected to the first power supply node and a cathode connected to the sensing circuit.

4. The ESD protection circuit of claim 2, wherein the blocking circuit includes a PMOS transistor having a source connected to the first power supply node, a drain connected to the sensing circuit, a gate connected to the sensing circuit, and a body connected to the sensing circuit.

5. The ESD protection circuit of claim 2, wherein the sensing circuit includes:
   a resistor having a first terminal connected to the first power supply node, and a second terminal connected to a first internal node;
   a capacitor connected between the first internal node and the second power supply node; and
   a PMOS sensing transistor, including a source connected to the blocking circuit at a second internal node, a drain connected to the control terminal of the shunt transistor, and a gate connected to the first internal node, the PMOS sensing transistor configured to provide the control voltage signal to the control terminal to turn on the shunt transistor in response to an increase in a voltage of the second internal node caused by the increase in the voltage of the first power supply node.

6. The ESD protection circuit of claim 5,
   wherein the charge pump capacitor includes a first terminal, and a second terminal connected to the blocking circuit at the second internal node; and wherein the switching circuit of the charge pump circuit includes:
an inverter circuit, including an inverter circuit input, an inverter circuit output connected to the first terminal of the charge pump capacitor, and an odd number N inverters connected in series between the inverter circuit input and the inverter circuit output, N being an odd integer greater than or equal to 1,
an NMOS charge pump trigger transistor, including a source connected to the second power supply node, a drain connected to the inverter circuit input, and a gate connected to the control terminal of the shunt transistor, and
a resistor connected between the inverter circuit input and the first power supply node.

7. The ESD protection circuit of claim 6, wherein the inverter circuit includes three inverters connected in series between the inverter circuit input and the first terminal of the charge pump capacitor.

8. The ESD protection circuit of claim 7, wherein the three inverters are CMOS inverters, each includes:
an inverter input,
an inverter output,
a PMOS transistor, including a source connected to the first power supply node, a drain connected to the inverter output, and a gate connected to the inverter input, and
an NMOS transistor, including a source connected to the second power supply node, a drain connected to the inverter output, and a gate connected to the inverter input.

9. The ESD protection circuit of claim 6, wherein the inverters are CMOS inverters, each includes:
an inverter input,
an inverter output,
a PMOS transistor, including a source connected to the first power supply node, a drain connected to the inverter output, and a gate connected to the inverter input, and
an NMOS transistor, including a source connected to the second power supply node, a drain connected to the inverter output, and a gate connected to the inverter input.

10. The ESD protection circuit of claim 1, wherein the sensing circuit includes:
a resistor having a first terminal connected to the first power supply node, and a second terminal connected to a first internal node;
a capacitor connected between the first internal node and the second power supply node; and
a PMOS sensing transistor, including a source connected to the charge pump circuit at a second internal node, a drain connected to the control terminal of the shunt transistor, and a gate connected to the first internal node, the PMOS sensing transistor configured to provide the control voltage signal to the control terminal to turn on the shunt transistor in response to an increase in a voltage of the second internal node caused by the increase in the voltage of the first power supply node.

11. The ESD protection circuit of claim 10,
wherein the charge pump capacitor includes a first terminal, and a second terminal connected to the source of the PMOS sensing transistor at the second internal node; and
wherein the switching circuit of the charge pump circuit includes:
an inverter circuit, including an inverter circuit input, an inverter circuit output connected to a first terminal of the charge pump capacitor, and an odd number N inverters connected in series between the inverter circuit input and the inverter circuit output, N being an odd integer greater than or equal to 1,
an NMOS charge pump trigger transistor, including a source connected to the second power supply node, a drain connected to the inverter circuit input, and a gate connected to the control terminal of the shunt transistor, and
a resistor connected between the inverter circuit input and the first power supply node.

12. The ESD protection circuit of claim 1,
wherein the charge pump capacitor includes a first terminal, and a second terminal coupled with the control terminal of the shunt transistor; and
wherein the switching circuit of the charge pump circuit includes:
an inverter circuit, including an inverter circuit input, an inverter circuit output connected to the first terminal of the charge pump capacitor, and an odd number N inverters connected in series between the inverter circuit input and the inverter circuit output, N being an odd integer greater than or equal to
an NMOS charge pump trigger transistor, including a source connected to the second power supply node, a drain connected to the inverter circuit input, and a gate connected to the control terminal of the shunt transistor, and
a resistor connected between the inverter circuit input and the first power supply node.

13. The ESD protection circuit of claim 12, wherein each inverter includes:
an inverter input,
an inverter output,
a PMOS transistor, including a source connected to the first power supply node, a drain connected to the inverter output, and a gate connected to the inverter input, and
an NMOS transistor, including a source connected to the second power supply node, a drain connected to the inverter output, and a gate connected to the inverter input.

14. The ESD protection circuit of claim 1, further comprising a resistor connected between the control terminal of the shunt transistor and the second power supply node.

15. An integrated circuit (IC), comprising:
a first power supply node;
a second power supply node;
a host circuit coupled with the first and second power supply nodes; and
an electrostatic discharge (ESD) protection circuit, comprising:
a clamp circuit, including:
a shunt transistor coupled between the first and second power supply nodes, the shunt transistor including a control terminal, and
a sensing circuit configured to deliver a control voltage signal to the control terminal to turn on the shunt transistor in response to a detected increase in a voltage of the first power supply node resulting from an ESD stress event, and
a charge pump circuit, including:
a charge pump capacitor, and
a switching circuit to charge the charge pump capacitor when the shunt transistor is off and to discharge the charge pump capacitor to boost the control voltage signal in response to the control voltage signal turning the shunt transistor on.

16. The IC of claim 15, further comprising a blocking circuit connected between the first power supply node and the sensing circuit, the blocking circuit configured to prevent current flow from the charge pump capacitor to the first power supply node, and to allow current flow from the first power supply node to the charge pump capacitor.

17. The IC of claim 15, wherein the sensing circuit includes:
   a resistor having a first terminal connected to the first power supply node, and a second terminal connected to a first internal node;
   a capacitor connected between the first internal node and the second power supply node; and
   a PMOS sensing transistor, including a source connected to the charge pump circuit at a second internal node, a drain connected to the control terminal of the shunt transistor, and a gate connected to the first internal node, the PMOS sensing transistor configured to provide the control voltage signal to the control terminal to turn on the shunt transistor in response to an increase in a voltage of the second internal node caused by the increase in the voltage of the first power supply node.

18. The IC of claim 15,
   wherein the charge pump capacitor includes a first terminal, and a second terminal coupled with the control terminal of the shunt transistor; and
   wherein the switching circuit of the charge pump circuit includes:
      an inverter circuit, including an inverter circuit input, an inverter circuit output connected to a first terminal of the charge pump capacitor, and an odd number N inverters connected in series between the inverter circuit input and the inverter circuit output, N being an odd integer greater than or equal to 1,
      an NMOS charge pump trigger transistor, including a source connected to the second power supply node, a drain connected to the inverter circuit input, and a gate connected to the control terminal of the shunt transistor, and
      a resistor connected between the inverter circuit input and the first power supply node.

19. The IC of claim 15, further comprising:
   an I/O pad configured to provide external connectivity to the host circuit;
   a first diode, including an anode connected to the I/O pad, and a cathode connected to the first power supply node; and
   a second diode, including an anode connected to the second power supply node, and a cathode connected to the I/O pad.

20. An electrostatic discharge (ESD) protection circuit, comprising:
   a shunt transistor coupled between first and second power supply nodes;
   a sensing circuit configured to deliver a control voltage signal to turn on the shunt transistor in response to a detected change in a voltage of the first power supply node resulting from an ESD stress event; and
   a charge pump circuit configured to boost the control voltage signal in response to the control voltage signal turning the shunt transistor on.

21. The ESD protection circuit of claim 20, wherein a normal voltage of the first power supply node is positive with respect to a normal voltage of the second power supply node.

22. The ESD protection circuit of claim 20, further comprising a blocking circuit connected between the first power supply node and the sensing circuit, the blocking circuit configured to prevent current flow from the charge pump circuit to the first power supply node, and to allow current flow from the first power supply node to the charge pump circuit.

23. The ESD protection circuit of claim 20, wherein the charge pump circuit includes:
   a charge pump capacitor having a first terminal, and a second terminal coupled with the control terminal of the shunt transistor; and
   a switching circuit, including:
      an inverter circuit, including an inverter circuit input, an inverter circuit output connected to the first terminal of the charge pump capacitor, and an odd number N inverters connected in series between the inverter circuit input and the inverter circuit output, N being an odd integer greater than or equal to 1,
      a charge pump trigger transistor, including a first terminal connected to the second power supply node, a second terminal connected to the inverter circuit input, and a control terminal connected to the control terminal of the shunt transistor, and
      a resistor connected between the inverter circuit input and the first power supply node.

24. The ESD protection circuit of claim 20, further comprising a resistor connected between the control terminal of the shunt transistor and the second power supply node.

* * * * *